United States Patent [19]
Gardner et al.

[11] Patent Number: 6,107,129
[45] Date of Patent: Aug. 22, 2000

[54] INTEGRATED CIRCUIT HAVING MULTIPLE LDD AND/OR SOURCE/DRAIN IMPLANT STEPS TO ENHANCE CIRCUIT PERFORMANCE

[75] Inventors: Mark I. Gardner, Cedar Creek; Fred N. Hause; H. Jim Fulford, Jr., both of Austin, all of Tex.

[73] Assignee: Advanced Micro Devices, Inc., Sunnyvale, Calif.

[21] Appl. No.: 09/038,511

[22] Filed: Mar. 11, 1998

Related U.S. Application Data

[62] Division of application No. 08/781,445, Jan. 10, 1997, Pat. No. 5,793,090.

[51] Int. Cl.$^7$ .................................................. H01L 29/72
[52] U.S. Cl. .................... 438/230; 438/231; 438/305; 438/525; 438/527; 257/335; 257/408
[58] Field of Search ........................... 257/408, 335; 438/230, 231, 305, 525, 527

[56] References Cited

U.S. PATENT DOCUMENTS

| | | |
|---|---|---|
| 5,308,780 | 5/1994 | Chou et al. . |
| 5,440,165 | 8/1995 | Mitsunaga et al. .................... 257/408 |
| 5,516,711 | 5/1996 | Wang ..................................... 257/408 |
| 5,567,965 | 10/1996 | Kim . |
| 5,591,650 | 1/1997 | Hsu et al. . |
| 5,793,090 | 8/1998 | Gardner et al. . |

*Primary Examiner*—Edward Wojciechowicz
*Attorney, Agent, or Firm*—Kevin L. Daffer; Conley, Rose & Tayon

[57] ABSTRACT

An integrated circuit is formed whereby MOS transistor junctions are produced which enhance the overall speed of the integrated circuit. The transistor junctions include multiple implants into the lightly doped drain (LDD) areas of the junction, the source/drain areas of the junction or both the LDD and source/drain areas. The first implant of the multiple implants serves to condition the implant area so that the second and subsequent implants are accurately placed with relatively high concentrations closely below the substrate surface. The resulting junction is therefore one which has relatively high drive strength, low contact resitivity, low source-to-drain parasitic resistance, and relatively low junction capacitance.

18 Claims, 5 Drawing Sheets

INTEGRATED CIRCUIT HAVING MULTIPLE LDD AND/OR SOURCE/DRAIN IMPLANT STEPS TO ENHANCE CIRCUIT PERFORMANCE

This is a Division of application Ser. No. 08/781,445, filed Jan. 10, 1997 now U.S. Pat. No. 5,793,090.

BACKGROUND OF THE INVENTION

1. Field of the Invention

This invention relates to semiconductor processing and, more particularly, to an integrated circuit having lightly doped drain (LDD) areas and source/drain areas with multiple implants for improving integrated circuit performance.

2. Description of Related Art

Fabrication of a metal-oxide semiconductor ("MOS") transistor is well known. The manufacture of an MOS transistor begins by defining active areas where the transistor will be formed. The active areas are electrically isolated from other areas on the semiconductor substrate by various isolation structures formed upon and within the substrate. Isolation structures come in many forms. For example, the isolation structures can be formed by etching trenches into the substrate and then filling the trenches with a dielectric fill material according to a shallow trench isolation technique. Isolation structures may also be formed by locally oxidizing the silicon substrate using the well recognized LOCOS process sequence.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal anneal chamber. A gate conductor material is then deposited across the entire dielectric-covered substrate. The gate conductor material is preferably polycrystalline silicon, or polysilicon. The polysilicon layer is then patterned using a photolithography mask. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

An n-channel transistor, or NMOS transistor, must in most instances be fabricated differently from a p-channel transistor, or PMOS transistor. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and the distance between junction regions is typically referred to as the physical channel length. After implantation and subsequent diffusion of the junction regions, the distance between the junction regions becomes less than the physical channel length and is often referred to as the effective channel length ("Leff"). In high density designs, not only does the physical channel length become small so too must the Leff As Leff decreases below approximately 1.0 μm, for example, a problem known as short channel effects ("SCE") becomes predominant.

A problem related to SCE, and the subthreshold currents associated therewith, but altogether different is the problem of hot-carrier effects ("HCE"). HCE is a phenomenon by which hot-carriers ("holes and electrons") arrive at or near an electric field gradient. The electric field gradient, often referred to as the maximum electric field ("Em"), occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 μm.

Unless modifications are made to the fabrication sequence, problems resulting from HCE will remain. To minimize these problems, a mechanism must be derived that disperses and thereby reduces Em. That mechanism is often referred to as the double-diffused drain ("DDD") and lightly doped drain ("LDD") techniques. The purpose behind using DDDs and LDDs structures is to absorb some of the potential into the drain and away from the drain/channel interface. The popularity of DDD structures has given way to LDD structures since DDD may cause unacceptably deep junctions and deleterious junction capacitance.

A conventional LDD structure is one whereby a light concentration of dopant is self-aligned to the edge of the gate conductor. The light-dopant concentration is then followed by a heavier-dopant concentration which is self-aligned to a spacer formed on the sidewalls of the gate conductor. The purpose of the first implant dose (LDD implant) is to produce a lightly doped section of the junction areas at the gate edge near the channel. The second implant dose (source/drain implant) is spaced from the channel a distance dictated by the thickness of the sidewall spacer. Resulting from the first and second implants, a dopant gradient occurs across the junction from the source/drain area of the junction to the LDD area adjacent the channel.

The dopant gradient across the junction, henceforth referred to as a graded junction, is necessary for several reasons. First, the lightly doped region (LDD area) is used to assume a substantial portion of the entire voltage drop attributed to Em. It has been reported that the LDD area may in some instances reduce Em at the drain juncture by approximately 30–40%. Secondly, the heavier dosage within the source/drain area forms a low resistivity region suitable for enhanced contact conductivity. Further, the source/drain dose is implanted at a higher energy necessary to produce deeper source/drain junctions and thereby provide better protection against junction spiking.

The benefits of using a combination LDD and source/drain implant differ depending upon whether an NMOS device or a PMOS device is produced. For example, an NMOS device requires an LDD area more so than a PMOS device. However, an unduly large LDD area would damper NMOS performance by increasing the source-drain resistance. On the other hand, the dopants used to form a PMOS device (i.e., boron) are more mobile than the dopants used to form an NMOS device. As such, the p-type dopants regularly segregate and migrate from their original implant position toward and into the channel area. This lessens Leff and produces deleterious SCE problems.

It would therefore be desirable to employ a fabrication process which can produce graded junctions. Those graded junctions serve to define LDD implant areas and source/drain implant areas, with the LDD area being relatively small compared to the source/drain area. It is desirable that the LDD area be particularly small on the source-side of the channel relative to the drain-side. This serves to lower parasitic resistance within the source/drain path. To achieve a differential between the source-side and the drain-side of the LDD area, an asymmetrical LDD implant process must be derived.

An improved process must not only take into account the benefits of an asymmetrical LDD implant, but must do so in order to enhance the overall performance of the ensuing transistor. The desired process must be capable of incorporating substantial amounts of dopants in critical source/drain areas so as not only to enhance ohmic connectivity but also to increase the drive strength of the transistor being formed. Drive strength, to some degree is related to a reduction in parasitic resistance. Functionally related to drive strength is the need to maintain drive capability without adding parasitic capacitance and jeopardizing transistor speed. Accordingly, enhancements to source/drain dopant concentration must take place without causing an unnecessary increase in junction profile depth. A process which can increase source/drain implant concentration within the confines of either a symmetrical or asymmetrical LDD spacer process is therefore desirable.

SUMMARY OF THE INVENTION

The problems outlined above are in large part solved by an improved fabrication process hereof The process can be used to form either PMOS or NMOS transistors. The MOS transistors are formed using LDD spacers, and the principle of lighter doped LDD regions adjacent a channel relative to heavier doped source/drain regions spaced from the channel. Of particular importance is the methodology by which the LDD areas and the source/drain areas are formed.

According to one embodiment, the LDD areas receive at least two separate implants. According to another embodiment, the source/drain areas receive at least two separate implants. The implants used in the LDD areas match the implants used in the source/drain areas only in that the same implant type (either n-type or p-type) is used.

Preferably, the first implant into the LDD area is of lesser concentration and at a deeper depth into the semiconductor substrate than the second implant into the LDD area. The first LDD implant may also be of a different atomic composition, or chemical composition than the second LDD implant. The first LDD implant principally serves to pre-condition the LDD area so that the second LDD implant is optimized. More specifically, the first LDD implant serves, inter alia, to somewhat disrupt the silicon substrate crystalline lattice in specific areas near the silicon substrate upper surface. Thus, the first LDD implant causes the localized regions of amorphous material to form near the substrate surface. It is desirable that a continuous amorphous layer does not form, and that localized regions of crystalline defects form. Those defects serve to minimize the phenomenon known as "channeling" when the second LDD implant occurs.

Once the first LDD implant is concluded, a second LDD implant occurs at a higher concentration density but at a lower energy than the first LDD implant. The second LDD implant comprises a plurality of dopants which distribute within the semiconductor substrate along a more Gaussian distribution relative to the first LDD implant. Thus, the first LDD implant serves more to randomize the crystalline structure within the range (depth area) of the second implant so that the second implant does not channel as its implant species is forwarded into the substrate. Accordingly, the second implant can be more readily predicted as to its location near the substrate surface. The amount of disruption caused by the first implant is carefully controlled so that channeling is minimized but not at the expense of having to remove substantial amounts of amorphous material. The removal process is often referred to as the "anneal" stage, wherein the present process employs a first implant recipe that does not require substantial anneal rework. A lower anneal temperature is a primary benefit if the first LDD implant is carefully controlled.

Subsequent to LDD area formation, the present process utilizes a spacer upon the gate conductor sidewall surfaces. The spacer, along with the gate conductor, serves as a mask for source/drain implants. The source/drain implants thereby occur after the LDD area (and associated multiple LDD implants) occur. The source/drain areas are formed somewhat similar to the LDD area in that multiple implants are used to enhance the connectivity and conductivity of the source/drain regions. The source/drain regions are formed by directing a first source/drain implant into the semiconductor substrate at a lower concentration but at a higher energy than a second source/drain implant. The combination of first and second source/drain implants serves to minimize the channel length and thereby repeatedly allows close control of where the majority source/drain dopants reside substantially near the substrate upper surface.

It is appreciated that there may be numerous LDD implants, beyond simply a first and second LDD implant. Further, it is believed that numerous source/drain implants may occur beyond simply two implants. It is also appreciated that the LDD implants, along with or separate from the source/drain implants, can be forwarded into the semiconductor substrate at angles which are not perpendicular to the substrate upper surface. More specifically, the implants may be forwarded at acute angles within the range preferably between 45° and 83° relative to the substrate upper surface. Typically, implants are formed approximately 7° from perpendicular (i.e., 83° from the substrate upper surface). However, by changing the implant angle and using what is known as large tilt angle ("LTA") implant, an asymmetrical transistor can be formed. The asymmetrical transistor is formed, provided consistent and uniform layout occurs. A benefit of an asymmetrical transistor is that a smaller source-side LDD may be produced relative to the drain-side LDD. This proves beneficial in reducing HCE along the critical drain side while at the same time reducing parasitic resistance in the non-critical source side. Alternatively, if desired, the source-side LDD area may be enhanced to accommodate highly mobile boron atoms present in the source region of a PMOS source/drain area. An LTA technique can thereby accommodate drain-side implants dissimilar to source-side in numerous combinations so as to achieve various goals depending upon whether the ensuing transistor is a PMOS or an NMOS device.

Broadly speaking, the present invention contemplates an integrated circuit. The integrated circuit comprises a gate conductor laterally defined between a pair of sidewall surfaces. The gate conductor, and sidewall surfaces, are spaced a dielectric distance above a semiconductor substrate. A first implant is arranged within the semiconductor substrate. The first implant comprises a plurality of first dopant species forwarded into the substrate at a first concentration and at a first concentration peak density. A second implant is also formed within the semiconductor substrate. The second implant comprises a plurality of second dopant species forwarded into the semiconductor substrate after the first dopant species are forwarded. The second dopant species are preferably forwarded at a second concentration greater than the first concentration and at a second concentration peak density shallower than the first concentration peak density. The plurality of first and second dopant species comprises either p-type or n-type species. Moreover, the plurality of first dopant species comprise atomic material of dissimilar or similar chemical composition and atomic weight to that of the plurality of second dopant species. The integrated circuit may further comprise a spacer extending laterally from the pair of sidewall surfaces, and a third and fourth implant formed within the semiconductor substrate and aligned with the outer sidewall surfaces of the spacer. The third implant comprises a plurality of third dopant species arranged within the semiconductor substrate at a third concentration and a third concentration peak density. The fourth implant comprises a plurality of fourth dopant species arranged within the semiconductor substrate at a fourth concentration greater than the third concentration and at a fourth concentration peak density shallower than the third concentration peak density.

The present invention further contemplates a method for forming an integrated circuit. The method comprises providing a dielectric-covered semiconductor substrate, and then patterning a gate conductor upon the dielectric semiconductor substrate. The gate conductor is patterned so that it has opposed sidewall surfaces such that a spacer can then be formed upon the opposed sidewall surfaces. Using the gate conductor and the spacer as a mask, a first source/drain implant species is implanted into a source/drain area within the semiconductor substrate. The gate conductor and spacer are maintained so that a second source/drain implant species is forwarded into the source/drain area at a greater concentration and a shallower depth than the first source/drain implant species. Prior to forming the spacer, the present invention further contemplates the possibility of using only the gate conductor as a mask. The gate conductor allows a first LDD implant species to be implanted into an LDD area within the semiconductor substrate. Thereafter, the gate conductor also serves to mask a second LDD implant species into the LDD area at a greater concentration and at a shallower depth than the first LDD implant species.

BRIEF DESCRIPTION OF THE DRAWINGS

Other objects and advantages of the invention will become apparent upon reading the following detailed description and upon reference to the accompanying drawings in which.

Figure 1:
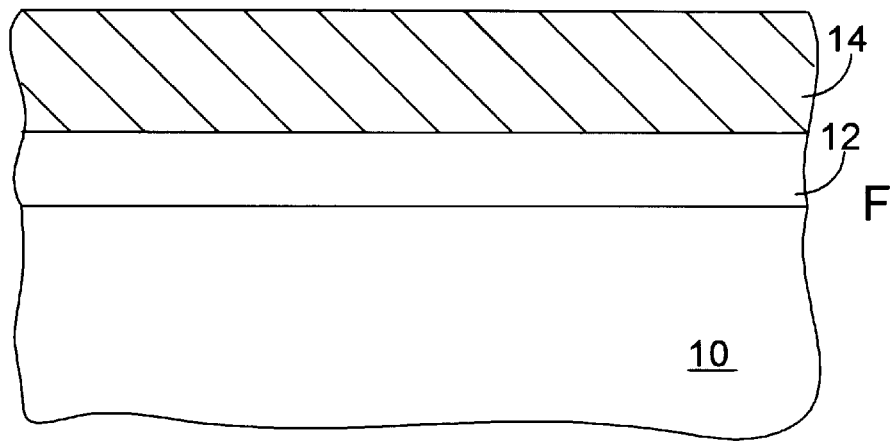
FIG. 1 is a partial cross-sectional view of a semiconductor topography showing a gate dielectric formed upon an active area of the topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 illustrates a partial cross-sectional view of a semiconductor substrate 10. Substrate 10 comprises a silicon-based material, preferably a single crystalline silicon material arranged in a fairly regular lattice pattern. Substrate 10 preferably contains a relatively light concentration of dopants, rendering it either n-type or p-type. Formed on the upper surface of substrate 10 is a gate dielectric 12. Gate dielectric 12 preferably comprises a grown oxide (i.e., silicon dioxide) grown from either a dry oxygen ambient or steam. The thickness of gate dielectric 12 can vary depending upon the required performance of the ensuing transistor. In many instances, the thickness varies between, for example, a range less than 100 angstroms to possibly several hundred angstroms.

Deposited upon gate dielectric 12 is a material 14. Material 14 can be deposited, for example, using a chemical vapor deposition (CVD) technique. According to a preferred embodiment, material 14 comprises a layer of polycrystalline silicon. The polycrystalline silicon ("polysilicon") can be rendered conductive by forwarding dopants into material 14 in latter processing steps.

Figure 2:
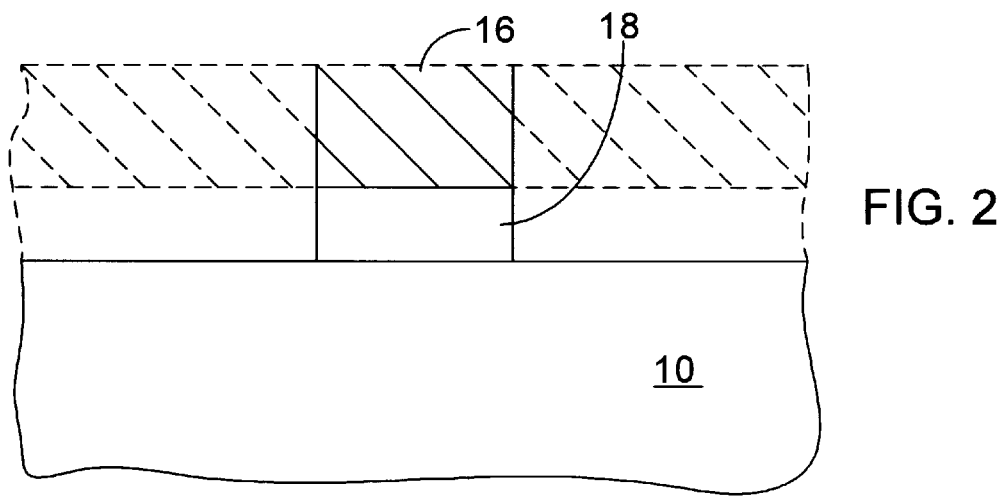
FIG. 2 is a partial cross-sectional view of the semiconductor topography according to a processing step subsequent to FIG. 1, wherein a gate conductor is formed having opposed sidewall surfaces.

FIG. 2 depicts a processing step subsequent to FIG. 1. Specifically, a lithography step is shown whereby select regions of material 14 are removed preferably along with gate dielectric 12. The removed regions are shown by dash line. What remains is gate conductor 16 aligned over a retained gate dielectric gate 18. The combination of gate conductor 16 and gate dielectric 18 exists in select regions defined as active regions of semiconductor substrate 10. Active regions are those regions which exist between electrical isolation structures. The isolation structures may be formed according to, for example, the shallow trench process or the LOCOS process.

Figure 3A:
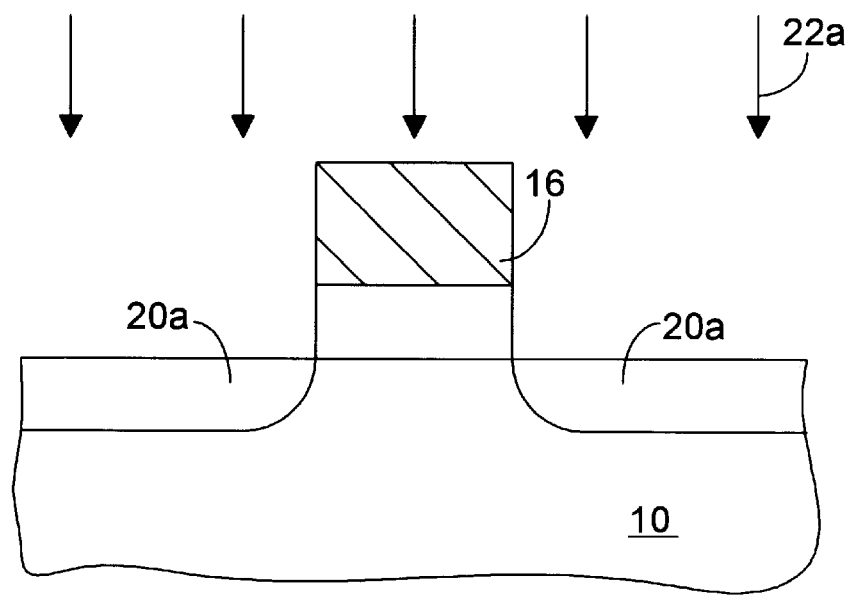
FIG. 3a is a partial cross-sectional view of a semiconductor topography according to a processing step subsequent to FIG. 2, wherein a first dopant species of an LDD implant is forwarded along a first implant angle into the semiconductor substrate.

FIG. 3a depicts a processing step subsequent to FIG. 2, according to one embodiment. Associated with the well-known self-aligned process, lightly doped drain (LDD) implant areas 20a are formed within substrate 10 on opposite sides of gate conductor 16. LDD implant area 20a occurs by forwarding an LDD implant 22a into substrate 10 using gate conductor 16 as a mask. LDD implant 22a and the resulting LDD area 20a is defined as one having a relatively low concentration of either n-type or p-type dopants. For example, the p-type dopants can be selected from the group comprising B, $BF_2$, BF, $B_{11}$ or In. If n-type dopants are used, those dopants can be selected from the group comprising As, P or Sb. The angle of incidence by which LDD implants 22a is forwarded into substrate 10 can vary. In the example shown in FIG. 3a, the angle of incidence is preferably chosen to be nearly perpendicular to the upper surface of substrate 10 (i.e., approximately 7° from perpendicular).

Figure 3B:
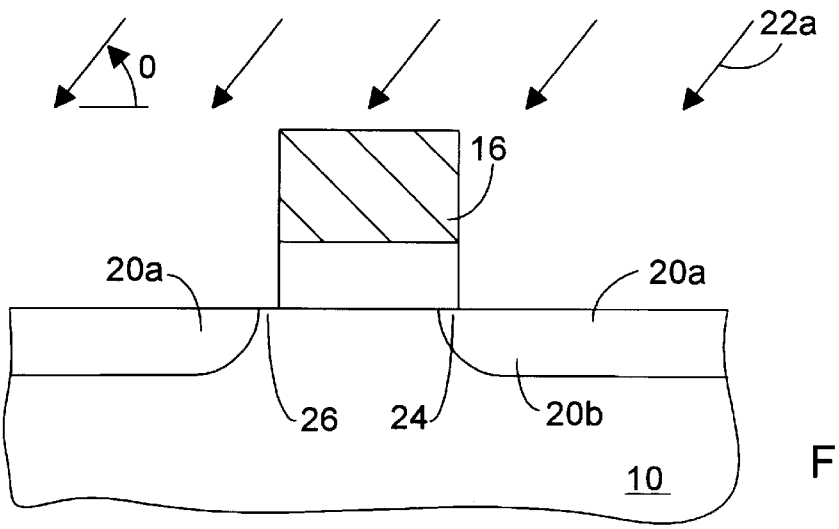
FIG. 3b is a partial cross-sectional view of the semiconductor topography according to an alternative processing step subsequent to FIG. 2, wherein a first dopant species of an LDD implant is forwarded along a second implant angle into the semiconductor substrate.

FIG. 3b depicts an alternative implant to that of FIG. 3a. Specifically, the angle of incidence of LDD implant 22a can be made less than perpendicular. In the example provided, the angle of incidence Ø is chosen to be approximately 45° relative to the upper surface of substrate 10. Resulting from a change in angle of incidence, a skewing of LDD implant area 20a occurs. The angle of incidence can vary depending upon the amount of skew needed. In the embodiment shown, it is desired to form one implant area slightly beneath gate conductor 16 while the other implant area is spaced from gate 16 according to reference numerals 24 and 26, respectively. The angle of the incidence is therefore shown to be important in adjusting the asymmetrical characteristics of LDD implant areas 20a. Provided the gate conductors are uniformly arranged across the semiconductor wafer, changes in angle of incidence may, for example, produce a consistently larger LDD area in the drain-side of the channel as opposed to the source-side of the channel. The benefits in having a larger drain-side LDD and a smaller source-side LDD are set forth above. Given a consistent layout, tilting the implanter source with respect to substrate 10 can therefore produce uniformly larger drain-side LDDs relative to source-side LDDs. For a PMOS device, however, it may be desirable to employ both a larger source-side LDD and larger drain-side LDD. To achieve this, a masking material may be needed in conjunction with the large tilt angle (LTA) implant. By masking the substrate on one side of gate conductor 16 and taking advantage of the shadowing of the other side, LDD can be spaced away from the gate conductor on the "shadowed" side. Thereafter, the masking material can be removed and the angle of incidence rotated 90° with respect to substrate surface to achieve shadowing on the other side, given a masking material placed on the previously deposited side. These and various other advantages may be achieved by using an LTA instead of, or possibly in addition to, a non-LTA implant such as that shown in FIG. 3a. Regardless of the implant chosen, the desired outcome is to produce an LTA area 20a of relatively light dopant concentration and implant energy relative to a subsequent source/drain implantation. The LTA area 20a can be laterally displaced, as needed, to enhance suppression of HCE while not at the detriment of adding parasitic source-to-drain resistance.

Figure 4A:
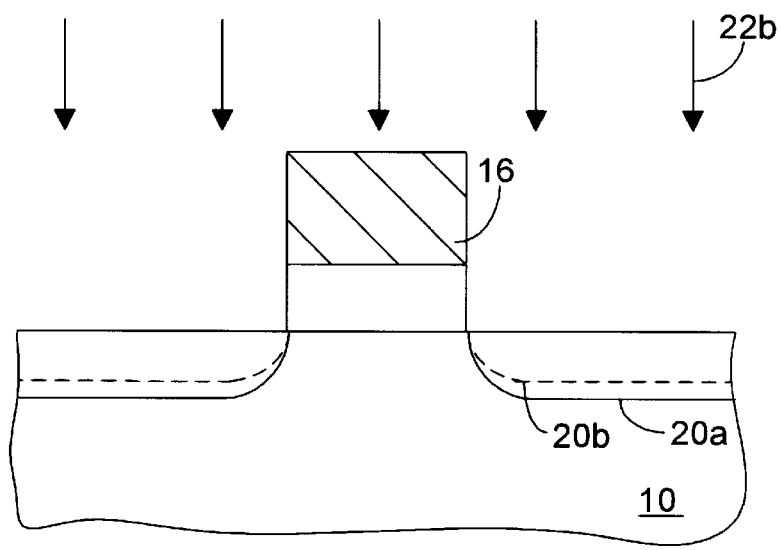
FIG. 4a is a partial cross-sectional view of the semiconductor topography according to a processing step subsequent to FIG. 3a, wherein second dopant species of a second LDD implant is forwarded along the first implant angle into the semiconductor substrate.
Figure 4B:
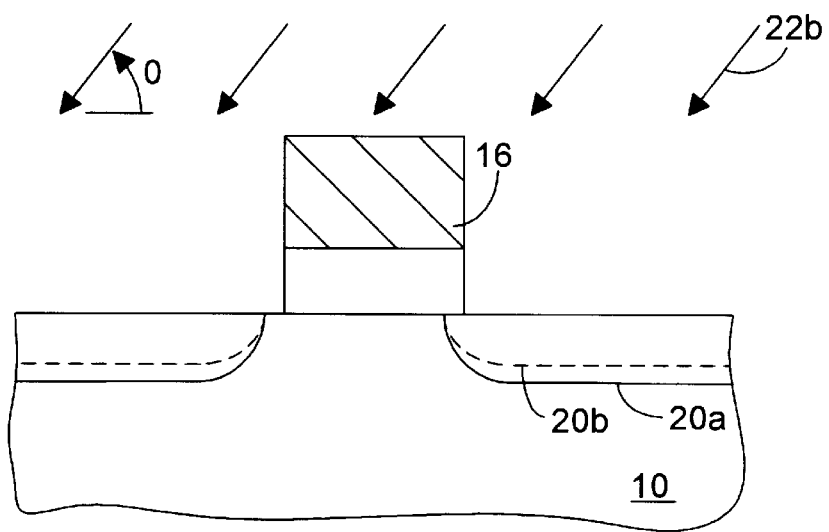
FIG. 4b is a partial cross-sectional view of the semiconductor topography according to a processing step subsequent to FIG. 3b, wherein second dopant species of a second LDD implant is forwarded along the second implant angle into the semiconductor substrate.

FIG. 4a depicts a processing step subsequent to FIG. 3a. Specifically, a second LDD implant area 20b is formed via second LDD implant 22b. In the embodiment shown, the implant angle chosen for second implant 22b parallels that of first implant 22a. The primary difference between implants 22a and 22b is the heavier concentration and lower implant energies associated with implant 22b relative to implant 22a. It is desired that first LDD implant 22a be driven at high enough energies to form localized disruption, and slight amorphization of small regions near the surface of substrate 10. The dosage of implant 22a is, however, quite small so that the LDD implant species remains somewhat shallow. However, the peak concentration densities of dopants associated with implant 22b are even shallower than those of implant 22a. It is postulated that the slight disruption or localized amorphization resulting from implant 22a allows more precise control over the placement of implants 22b within substrate 10. The amount of control is believed to be partially due to avoidance of "channeling" which often occurs if localized disruption or amorphization does not preexist the implant. Accordingly, first LDD implant 22a serves as a pre-conditioning implant for second LDD implant 22b. It is the second LDD implant that places the majority if not almost the entire LDD dopant species within the corresponding LDD area 20. It is important to have the pre-conditioning step in order to place the critical LDD area (i.e., majority LDD dopants) as near to the substrate surface as possible and with as many dopants species as possible. FIG. 4b depicts processing steps subsequent to FIG. 3b. A second LDD implant 22b is shown directed at an angle 0 substantially identical to the angle of incidence shown in FIG. 3b. The combination of first and second LDD implants 22 causes an appropriate skewing of LDD implant area 20, as shown in FIG. 4b. It is appreciated that the amount of skew is dependent upon the desired LDD characteristic to be achieved. However, regardless of the amount of skew desired, the objective is to utilize a second LDD implant 22b which has a higher dopant concentration and lower implant energies than first LDD implant 22a, similar to the parallelism drawn between the embodiment shown in FIGS. 3a and 4a.

Figure 5:
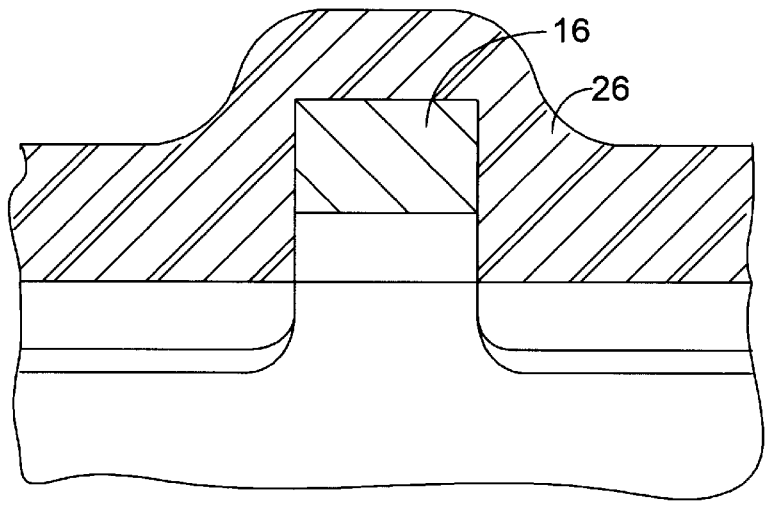
FIG. 5 is partial cross-sectional view of the semiconductor topography according to a processing step subsequent to FIG. 4a or 4b, wherein a spacer material is deposited across the gate conductor.

FIG. 5 depicts a processing step subsequent to either FIG. 3b or FIG. 4b. Deposited across the semiconductor topography, and specifically upon the junction areas and gate conductor 16 between the junction areas is a spacer material 26. Spacer material 26 preferably comprises a dielectric substance, according to one embodiment. The dielectric can, for example, be a chemical vapor deposited oxide or nitride. Alternatively, material 26 comprises any material which etches at a substantially slower rate than that of the polysilicon of gate conductor 16 or the silicon of substrate 10. For example, material 26 can be a conductive material such as metal. If a metal is chosen, it is likely that material 26, and the ensuing spacer material, is a sacrificial material which must be removed and thereafter replaced by a dielectric spacer. The metal spacer need be replaced so that bridging of silicide from the upper surface of gate conductor 16 to the junction areas of LDD and source/drain regions does not occur.

Figure 6:
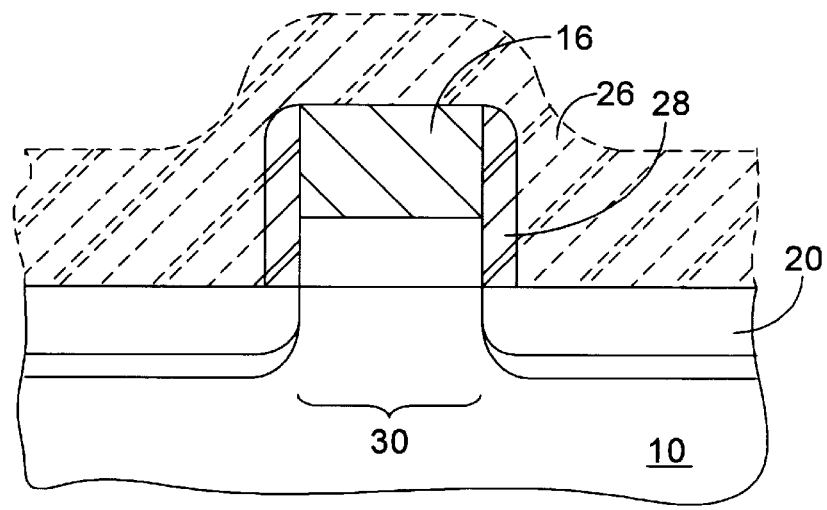
FIG. 6 is a partial cross-sectional view of the semiconductor topography according to a processing step subsequent to FIG. 5, wherein the spacer material is partially removed leaving spacers adjacent the sidewall surfaces.

FIG. 6 depicts a processing step subsequent to FIG. 5, whereby material 26 is removed from substantially horizontal surfaces at a faster rate than removal from substantially vertical surfaces. This removal process is often referred to as an "anisotropic" etch process. The etch duration is terminated, however, before the entirety of material 26 is removed. Accordingly, anisotropic etch duration is chosen to remove material from the upper surface of the LDD areas as well as from the upper surface of gate conductor 16. However, a spacer 28 is retained on the sidewall surfaces of gate conductor 16. Spacer 28 is produced so that it extends laterally from gate conductor 16 into the junction areas and specifically over the portion of LDD region 20 adjacent channel 30. Anisotropic etch processes are generally well known. For example, certain plasma or "dry" etch techniques can be classified as an anisotropic etch used to remove horizontal surfaces faster than vertical surfaces. Those etch techniques generally comprises ion-assisted bombardment of the horizontal surfaces in addition to chemical reaction on those surfaces. Various parallel-plate reactors prove beneficial in this result.

Figure 7A:
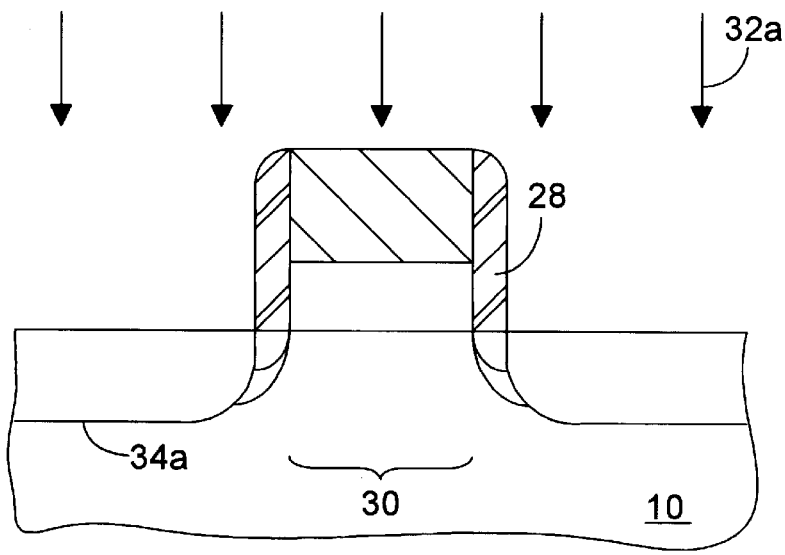
FIG. 7a is a partial cross-sectional view of the semiconductor topography according to a processing step subsequent to FIG. 6, wherein third dopant species of a first source/drain implant is forwarded along the first implant angle into the semiconductor substrate.

FIG. 7a illustrates a first source/drain implant 32a forwarded into substrate 10. Implant 32a is masked away from channel 30 in accordance with spacer 28 thickness. The result of implant 32a is a first source/drain implant area 34a. Source/drain implant area 34a is laterally spaced from the sidewall of the gate conductor by spacer 28.

Figure 7B:
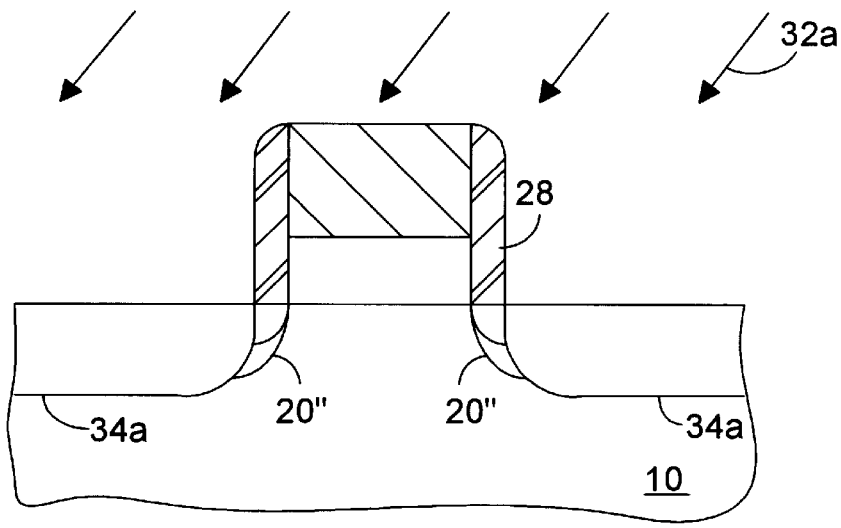
FIG. 7b is a partial cross-sectional view of the semiconductor topography according to an alternative processing step subsequent to FIG. 6, wherein third dopant species of a first source/drain implant is forwarded along the second implant angle into the semiconductor substrate.

FIG. 7b depicts an alternative implant angle from that of FIG. 7a. Specifically, FIG. 7b illustrates first source/drain implant 32a forwarded at an angle of incidence between 0° and 83° relative to the upper surface of substrate 10. Conversely, FIG. 7a illustrates an angle of incidence of 7° from perpendicular (83° from the substrate surface) or, alternatively, perpendicular (or 90°) from the substrate surface. Resulting from the tilt afforded by the implant shown in FIG. 7b, a skew of source/drain implant area 34a occurs. The amount of skew is demonstrated by the length of the pre-existing LDD area 20. Depending upon whether the LDD area is formed by an LTA, and depending upon the angle in which the LTA implant occurs, the length of LDD area at the source side is purposely dissimilar from the length at the drain side. In the example of FIG. 7b, the drain side LDD 20' is greater than the source side LDD 20".

Figure 8A:
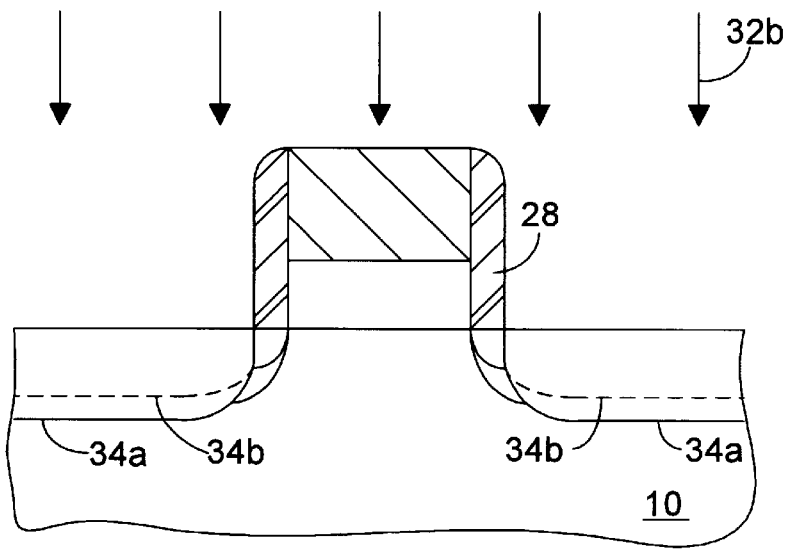
FIG. 8a is a partial cross-sectional view of the semiconductor topography according to a processing step subsequent to FIG. 7a, wherein fourth dopant species of a second source/drain implant is forwarded along the first implant angle into the semiconductor substrate.

FIG. 8a illustrates a processing step subsequent to FIG. 7a, wherein a second source/drain implant 32b is forwarded into substrate 10 to form a second source/drain implant area 34b. Similar to the first source/drain implant area, the second source/drain implant area 34b is laterally spaced from the sidewall of the gate conductor by spacer 28.

Figure 8B:
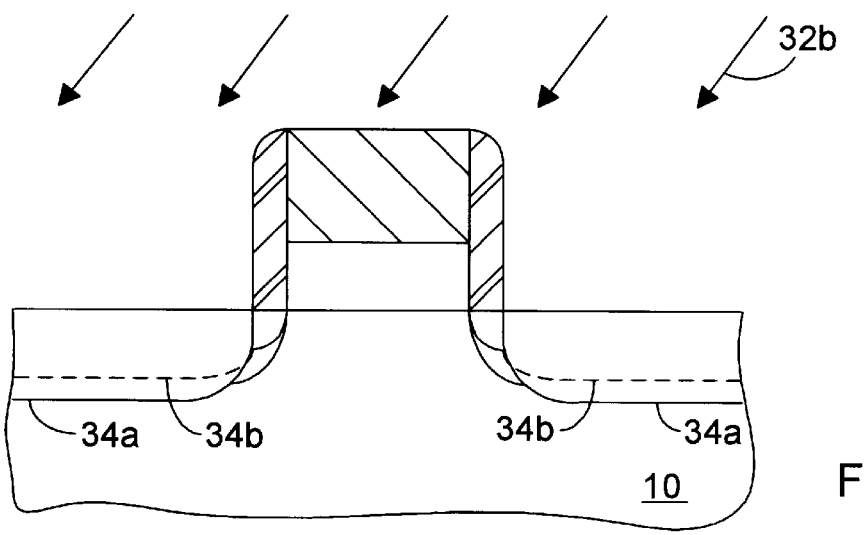
FIG. 8b is a partial cross-sectional view of the semiconductor topography according to a processing step subsequent to FIG. 7b, wherein fourth dopant species of a second source/drain implant is forwarded along the second implant angle into the semiconductor substrate.

FIG. 8b depicts a processing step subsequent to FIG. 7b, wherein an LTA implant occurs. The LTA implant is associated with second source/drain implant 32b to cause a skew of second source/drain implant area 34b. The amount of skew afforded by the LTA implant depends upon whether the pre-existing LDD area is formed by an LTA, and the angle or direction at which the pre-existing LTA implant occurs relative to the source/drain LTA implant. In the example shown, the pre-existing LDD implant occurs with a parallel LTA implant. However, it is understood that the pre-existing LDD implant may undergo non-LTA which would either cause the skewness to increase or decrease depending upon the relative angles of the LTA implants.

FIGS. 8a and 8b describe second source/drain implants 32b which are placed at a shallower depth using a lower implant energy than the first source/drain implants 32a. It is also appreciated that the second source/drain implant 32b forwards a greater number of dopants than the first source/drain implant 32a. The reasons for the disparity between implant energies and implant concentrations are similar to those described in reference to the LDD implants. It is understood that the present process sequence can thereby undergo multiple LDD implants and multiple source/drain implants, beyond merely two implants as shown. If multiple implants are needed, then the third, fourth, etc., LDD and source/drain implants may be progressively shallower than the second LDD and source/drain implants but possibly of comparable concentrations. It is also understood that the present process flow may merely undergo multiple source/drain implants in lieu of or in addition to multiple LDD implants. Depending upon the desired source/drain resistivity and LDD resistivity, implants in those areas may either be singular or multiple. It is still further understood that the present process may forego spacers in the incorporation of LDD areas, and merely focus upon multiple source/drain implants if desired. Alternatively, the present process may forego multiple source/drain implants and focus simply on multiple LDD implants. The aforementioned permutations all fall within the spirit and scope of the present invention.

Figure 9:
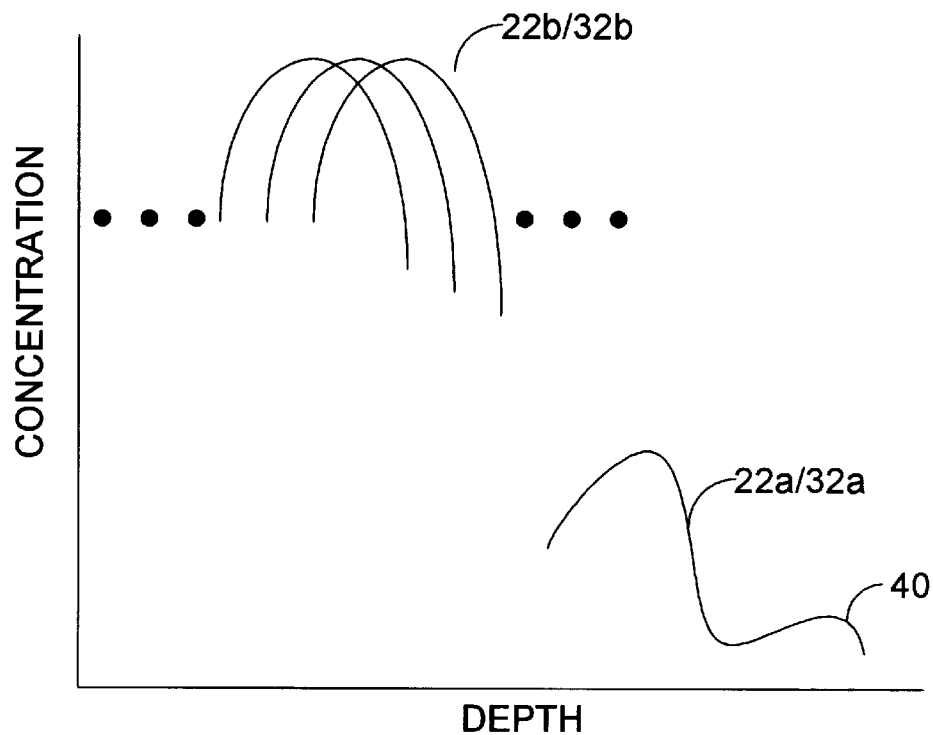
FIG. 9 is a graph of dopant concentration versus depth of the LDD implant or source/drain implant prior to anneal.

Referring to FIG. 9, a graph of concentration versus depth of the various LDD and source/drain implants are shown prior to anneal. The concentration and depth are in arbitrary units so as to depict only the relationship between the various implants. Therefore, for use as an example, FIG. 9 illustrates a first LDD or first source/drain implant 22a/32a. First implant 22a/32a is purposefully placed at a greater depth below the surface of substrate 10 relative to the second and subsequent LDD and source/drain implants 22b/32b. FIG. 9 indicates possibly numerous implants which might come as second (and subsequent) LDD and source/drain implants 22b and 32b. Those implants are represented as having approximately the same concentration density but at possibly dissimilar depths within substrate 10. All of implants 22b/32b are placed at a shallower depth but at greater concentrations than implants 22a/32a. Preferably, all of implants 22b/32b have approximately the same concentration implant level.

FIG. 9 illustrates a "tail" 40 associated with implants 22a/32a. Tail 40 exists primarily due to the channeling effect present whenever implants are forwarded into a single crystalline lattice. The channeling can be somewhat reduced if, for example, the implant angle is adjusted from a perpendicular orientation. Nonetheless, due to the crystalline nature of the substrate, channeling remains to some degree. It is desirable to reduce the amount of channeling whenever precise dopant concentrations and dopant positions are needed. Accordingly, second implants 22b/32b take advantage of disruptions in the silicon lattice caused by the first implants 22a/32a randomizing the second implant according to standard gaussian curves shown in FIG. 9. Those gaussian curves allow somewhat precise knowledge of where within substrate 10 the final, heavy dopants are to exist.

Figure 10:
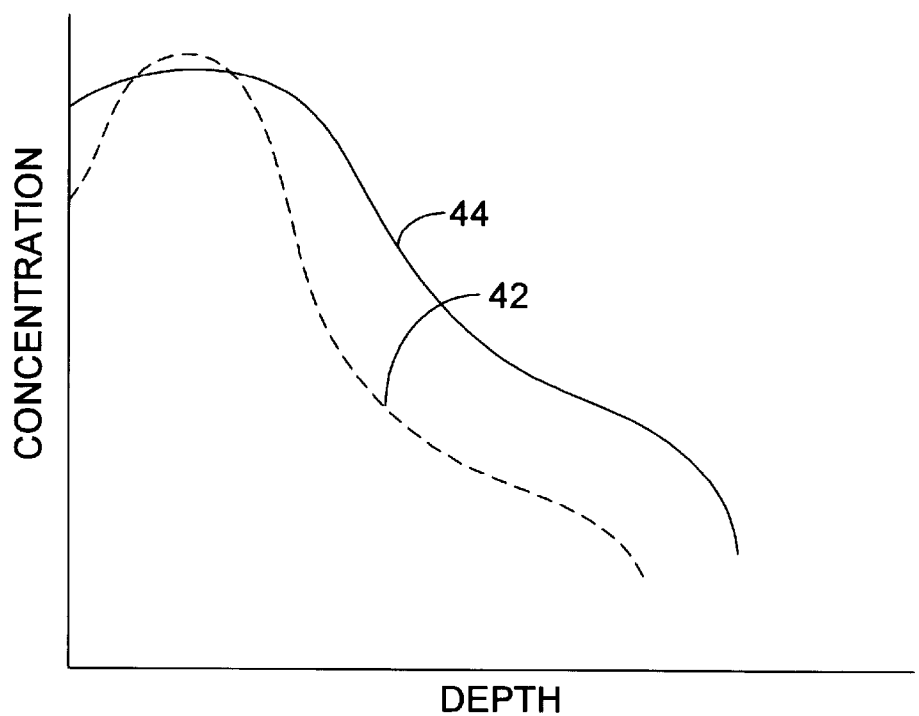
FIG. 10 is a graph of dopant concentration versus depth of the LDD implants or source/drain implants after anneal.

The amount of disruption to the crystalline lattice resulting from the first implant is carefully controlled so that the disruption is not so large as to cause a continuous amorphous region. Instead, disruption is somewhat localized and therefore can be more readily removed using a lower anneal temperature as shown in FIG. 10. A lower anneal temperature will serve to activate the implanted ions while at the same time removing the lattice disruption which occurs from the previous implant step. The lower temperature anneal is shown by curve 42, whereas the higher temperature anneal is shown by curve 44. Curves 42 and 44 are shown as approximations as to what might occur given the pre-conditioning implant followed by heavier concentration, shallower implants. In many instances, the lower temperature curve may prove satisfactory and therefore the additional smoothing afforded by the higher temperature curve 44 may not be needed. Merely as an example, it is postulated that the temperature differential may be greater than 100° C. For example, anneal necessary to activate boron implants when the pre-conditioning implant is used can range between a high temperature anneal 44 and a low temperature anneal 42 of approximately 900° C. downward to 700° C. The use of a pre-conditioning implant therefore not only helps to slightly amorphize or "condition" the substrate but also allows for a more precise placement of subsequent implants due to their retainage in the targeted implant areas. That retainage is primarily due to the possibility of having a lower anneal temperature afforded by the present process. Multiple post-amorphization implant of approximately the same concentration but at different energies helps produce a somewhat flat doping profile, or linear doping profile as desired. The doping profile might therefore not only be controlled due to the pre-existing, pre-conditioning implant step but also can be made quite concentrated near the substrate surface. This affords a lower contact resistivity, lower parasitic resistance, and a lower parasitic capacitance in the critical junctions areas.

It will be appreciated to those skilled in the art having the benefit of this disclosure that this invention is believed to be capable of forming MOS transistor junctions which are graded in accordance with possibly numerous LDD implants as well as possibly numerous source/drain implants. It is understood that the form of the invention shown and described is to be taken as exemplary, presently preferred embodiments. Various modifications may be made to each and every processing step without departing from the spirit and scope of the invention given the benefit of this disclosure as set forth in the claims. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:

patterning a gate conductor upon a dielectric covered semiconductor substrate, said gate conductor having opposing sidewall surfaces;

using the gate conductor as a mask, implanting a first lightly doped drain (LDD) implant species into a first LDD area within the semiconductor substrate;

using the gate conductor as a mask, implanting a second LDD implant species into a second LDD area at a greater concentration and at a shallower depth than the first LDD implant species;

subsequently forming a spacer upon each of the opposing sidewall surfaces;

using the gate conductor and the spacer as a mask, implanting a first source/drain implant species into a first source/drain area laterally spaced from a sidewall surface of the gate conductor and within the semiconductor substrate; and using the gate conductor and the spacer as a mask, implanting a second source/drain implant species into a second source/drain area laterally spaced from the sidewall surface of the gate conductor at a greater concentration and at a shallower depth than the first source/drain implant species.

2. The method as recited in claim 1, wherein said forming comprises:

depositing a spacer material across the patterned said gate conductor; and removing said spacer material from horizontal surfaces at a faster rate than from vertical surfaces; and terminating removing said spacer material prior to removing said spacer material from the vertical surface comprising said sidewall spacer.

3. The method as recited in claim 1, wherein said implanting a first source/drain implant species and said implanting a second source/drain implant species both comprise implanting species into the semiconductor substrate at approximately the same implant angle.

4. The method as recited in claim 3, wherein said implanting a first source/drain implant species and said implanting a second source/drain implant species both comprise implanting species into the semiconductor substrate at an acute angle to the semiconductor substrate.

5. The method as recited in claim 4, wherein the acute angle is between 45 and 83 degrees.

6. The method as recited in claim 1, wherein said implanting a first source/drain implant species comprises implanting into said semiconductor substrate at a substantially different angle than said implanting a second source/drain species.

7. The method as recited in claim 1, wherein said implanting a first LDD implant species comprises implanting into said semiconductor substrate at a substantially different angle than said implanting a second LDD implant species.

8. The method as recited in claim 1, wherein the first source/drain implant species and the second source/drain implant species are the same impurity type.

9. The method as recited in claim 1, wherein the first source/drain implant species, the second source/drain implant species, the first LDD implant species, and the second LDD implant species are the same impurity type.

10. The method as recited in claim 1, wherein both said implanting a first source/drain implant species and said implanting second source/drain implant species comprise greater impurity concentrations than said implanting a first LDD implant species and said implanting a second LDD implant species.

11. The method as recited in claim 1, wherein said implanting a first source/drain implant species and said implanting a second source/drain implant species are performed subsequent to said implanting a first LDD implant species and said implanting a second LDD implant species.

12. The method as recited in claim 1, wherein said first source/drain area is laterally spaced from the sidewall surface of the gate conductor by approximately a thickness of the spacer, and wherein the spacer is arranged exclusively on sidewall surfaces of the gate conductor.

13. A method for forming an integrated circuit, comprising:

implanting a first source/drain implant species into a first source/drain area within a semiconductor substrate and arranged on opposite sides of and laterally spaced from sidewall surfaces of a gate conductor, the gate conductor being arranged above the semiconductor substrate, wherein said implanting a first source/drain implant species partially amorphizes the semiconductor substrate within the first source/drain area; and implanting a second source/drain implant species into a second source/drain area within the semiconductor substrate and arranged on opposite sides of and laterally spaced from the sidewall surfaces of the gate conductor, wherein said implanting a second source/drain implant species comprises a greater impurity concentration and a shallower implant depth than said implanting a first source/drain implant species, and wherein the partially amorphized portion of the semiconductor substrate within the first source/drain area inhibits channeling of the second source/drain species during said implanting a second source/drain implant species.

14. The method as recited in claim 13, further comprising prior to said implanting a first source/drain implant species and said implanting a second source/drain implant species:

implanting a first lightly doped drain (LDD) implant species into a first LDD area within the semiconductor substrate, wherein the first LDD area is closer to the sidewalls surfaces of the gate conductor than the first source/drain area; and implanting a second LDD implant species into a second LDD area at a greater impurity concentration and at a shallower implant depth than the first LDD implant species, wherein the second LDD area is closer to the sidewalls surfaces of the gate conductor than the second source/drain area.

15. The method as recited in claim 14, wherein the first LDD area comprises a source-side LDD region and a drain-side LDD region, and wherein the drain-side LDD region of the first LDD area extends beneath the gate conductor.

16. The method as recited in claim 15, wherein the drain-side LDD region of the first LDD area is longer than the source-side LDD region of the first LDD area.

17. The method as recited in claim 14, wherein said implanting a first LDD implant species partially amorphizes the semiconductor substrate within the first LDD area.

18. The method as recited in claim 13, wherein said implanting a second source/drain implant species is performed subsequent to said implanting a first source/drain implant species.

* * * * *